United States Patent [19]

Hess et al.

[11] 4,257,055

[45] Mar. 17, 1981

[54] NEGATIVE RESISTANCE HETEROJUNCTION DEVICES

[75] Inventors: Karl Hess, Urbana; Ben G. Streetman, Champaign; Hadis Morkoc, Urbana, all of Ill.

[73] Assignee: University of Illinois Foundation, Urbana, Ill.

[21] Appl. No.: 60,893

[22] Filed: Jul. 26, 1979

[51] Int. Cl.³ .......................................... H01L 29/161
[52] U.S. Cl. .......................................... 357/16; 357/4; 357/30; 357/57
[58] Field of Search ........................... 357/57, 16, 30, 4

[56] References Cited

U.S. PATENT DOCUMENTS

| | | | |
|---|---|---|---|
| 3,626,257 | 12/1971 | Esaki | 317/239 R |
| 3,893,148 | 7/1975 | Madjid | 357/16 |
| 3,982,207 | 9/1976 | Dingle | 331/94.5 H |
| 4,103,312 | 7/1978 | Chang | 357/16 |
| 4,163,237 | 7/1979 | Dingle | 357/16 |
| 4,163,238 | 7/1979 | Esaki | 357/17 |

*Primary Examiner*—Martin H. Edlow
*Attorney, Agent, or Firm*—David N. Koffsky; Martin Novack

[57] ABSTRACT

Described is a heterostructure semiconductor device of sandwich type construction. The central layer exhibits high charge carrier mobility and a relatively narrow band gap characteristic. The outer sandwich layers exhibit low charge carrier mobilities and a larger band gap characteristic. Under quiescent conditions, the charge carriers from the outer sandwich layers reside in the central layer due to the "potential well" created by the band gap difference between the layers. The application of an appropriate electrical field to the central layer, aligned with the interface between the layers, causes a very rapid transfer of the electrons residing therein to the outer sandwich layers. This transfer results in the device exhibiting a negative resistance characteristic. Two and three terminal switching applications of the device are described as well as its application as a radiant energy detector.

10 Claims, 6 Drawing Figures

NEGATIVE RESISTANCE HETEROJUNCTION DEVICES

This invention was developed with financial support of the Joint Service Electronics Program (U.S. Army, U.S. Navy, U.S. Air Force) under Contract DAAG-16-78-C-0016 and under Office of Naval Research, Contract N00014-76-C-0806.

BACKGROUND OF THE INVENTION

1. Field of the Invention

This invention relates to semiconductor switching devices and more particularly to heterojunction semiconductor devices which exhibit a negative resistance effect (i.e., wherein there is a decrease of current with increases in voltage).

2. Prior Art

One of the more well known negative resistance devices is the Gunn diode. That device is a bulk GaAs semiconductor which operates by a "transferred electron" mechanism. In most semiconductors the carriers reach a scattering limited velocity and the velocity vs. field plot saturates at a high field level. In some materials, however, e.g., GaAs, the energy of electrons can be raised by an applied field to the point that they transfer from one region of the conduction band to another higher energy region of the same conduction band. In n-type GaAs, the valence band is filled and the "central valley" or "minimum" of the conduction band normally contains the conduction electrons. There is a set of subsidiary minima or "satellite-valleys" at a higher energy within the conduction band but these are normally unoccupied by electrons.

If the GaAs is subjected to an electric field above some critical value, about 3,500 volts per cm, the electrons in the central valley gain more energy than the gap separating the central from the satellite valleys, (i.e., 360 meV) and there is considerable scattering into these higher energy satellite valleys. Once into the higher energy valleys, the electrons remain there as long as the field is greater than the critical value. Thus, once the field increases above the critical value, most conduction electrons in GaAs reside in the satellite valleys and exhibit properties typical of that region of the conduction band. In particular, the effective mass for electrons in the higher valleys is almost 20 times as great as in the central valley and the electron mobility is much lower. This is important when considering the negative conductivity mechanism since in the GaAs, as the electric field is increased, the electron velocity increases until a critical field is reached and then the electrons slow down with further increases in field. Obviously, while electrons are in the central valleys, they have a much higher effective mobility than when in the satellite valleys. Therefore, as more carriers transfer into the satellite valleys, and experience significant decreases in their mobility, the current passing through the GaAs decreases (even though there is increasing applied voltage) thus giving rise to the negative resistance characteristic. It is important to realize that this negative conductivity effect depends only on the bulk properties of the semiconductor and not on junction or surface effects.

On a related front, a line of semiconductor developments relating to semiconductor heterojunction structures has been progressing. Such structures generally involve either multilayer heterojunction arrangements or a periodic alternation of the doping of only one semiconductor to form a series of homojunctions. In U.S. Pat. No. 3,982,207, there is disclosed a heterostructure laser having a multilayer semiconductor body which includes an active region having a plurality of thin narrow band gap active layers interleaved with a plurality of thin relatively wider band gap passive layers. The passive layers are thin enough (indicated as being less than about 500 Angstroms) to permit carriers to distribute themselves among the active layers when the body is pumped either optically or electrically. The distribution of carriers is stated to occur either through tunneling or by hopping over the energy barriers created by the passive layers. The active layers are thin enough to separate the quantum levels of confined carriers. In this manner the patent indicates that the quantum size effects are exploited to produce wave length tunability without having to rely on changes of the composition of the active region and also to achieve lower lasing thresholds. It will be noted that the essence of that structure involves the application of pumping voltages in a manner orthogonal to the junction interfaces between the structures.

More recently, investigations of multilayer $Al_xGa_{1-x}As/GaAs/Al_xGa_{1-x}As$ structures have shown that they can be constructed in such a manner as to provide a very high mobility in the GaAs layer which exceeds that of otherwise equivalent epitaxial GaAs. (Dingle, et. al., "Electron Mobilities in Modulation-Doped Semiconductor Heterojunction Super Lattices", Applied Physics Letter, 33 (7), Oct. 1, 1978, pp. 665–667).

SUMMARY OF THE INVENTION

A multilayer heterojunction semiconductor device has been invented which employs lattice-matched hetero-structures wherein the band gap of a central layer is less than the band gap of adjoining layers. The adjoining layers exhibit a relatively low charge carrier mobility as compared to the charge carrier mobility of the lesser band gap material. As a result of this structure, and under quiescent conditions, the charge carriers from the adjoining layers migrate to and reside in the central layer. By applying an electric field substantially parallel to the interface between such layers, the charge carriers in the lesser band gap material are sufficiently excited to move from the central material into the higher band gap adjoining layers. This results in a significant decrease in current passing through the central material, and the creation of a "negative resistance" characteristic. A variety of devices can be constructed applying this "hot charge carrier" phenomenon.

Accordingly, it is an object of this invention to provide a multilayer heterojunction semiconductor device which exhibits a negative resistance characteristic and which is capable of carrier transfer in extremely short time intervals.

It is a further object of this invention to provide an improved heterojunction switching device.

It is another object of this invention to provide a multilayer negative resistance heterojunction device whose negative resistance characteristic may be adjusted by adjustment of the elemental makeups of various layers of the device.

These and other objects of the present invention are explained in greater detail in the following material.

BRIEF DESCRIPTION OF THE DRAWINGS

FIG. 4b, is a section view along lines 4b—4b in FIG. 4a.

DETAILED DESCRIPTION

Figure 1:
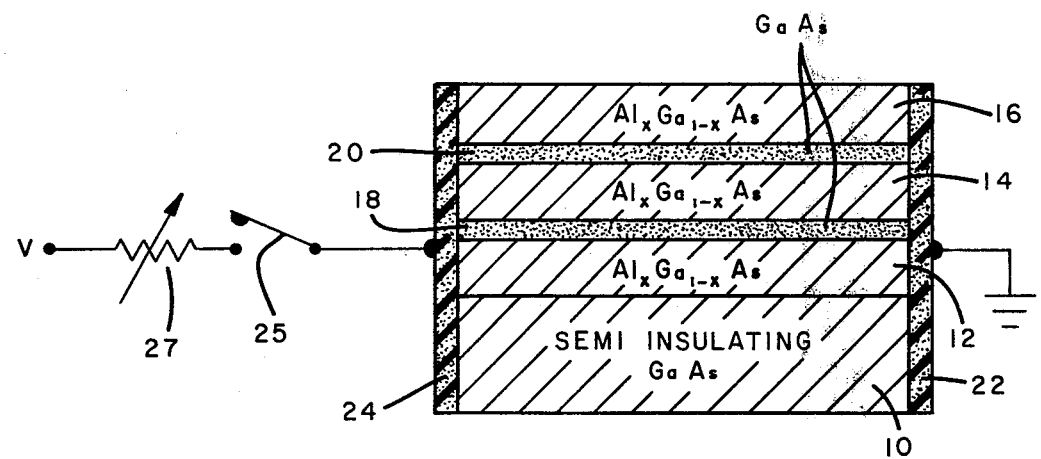
FIG. 1, is a schematic sectional view of a heterostructure semiconductor device constructed in accordance with the invention.

Referring now to FIG. 1, there is shown an illustrative embodiment of a heterostructure semi-conductor device, fabricated preferably by molecular beam epitaxy (MBE) techniques or by any other technique which is capable of producing the required layer thicknesses. The structure shown in FIG. 1, will be hereinafter described with relation to interspersed layers of GaAs/$Al_xGa_{1-x}As$. It should be understood at the outset that in lieu of the GaAs/$Al_xGa_{1-x}As$ family, any family of lattice-matched materials can be employed. For instance the quaternary alloy $In_xGa_{1-x}As_yP_{1-y}$ is also a suitable family as are many others which meet the following requirements: (1) the semiconductor layers must be lattice-matched, (2) the "sandwich" layers must exhibit a relatively low charge carrier mobility and (3) the intermediate layer must exhibit a high charge carrier mobility and a band gap of lesser magnitude than the sandwich layers.

$Al_xGa_{1-x}As$ layers 12, 14 and 16 in FIG. 1 are interspersed with GaAs layers 18 and 20 upon semi-insulating GaAs substrate 10. Electrical contacts 22 and 24 are formed along the ends of the respective layers with contact 22 being connected to ground and contact 24 to a source of voltage through switch 25 and variable resistance 27.

Figure 2:
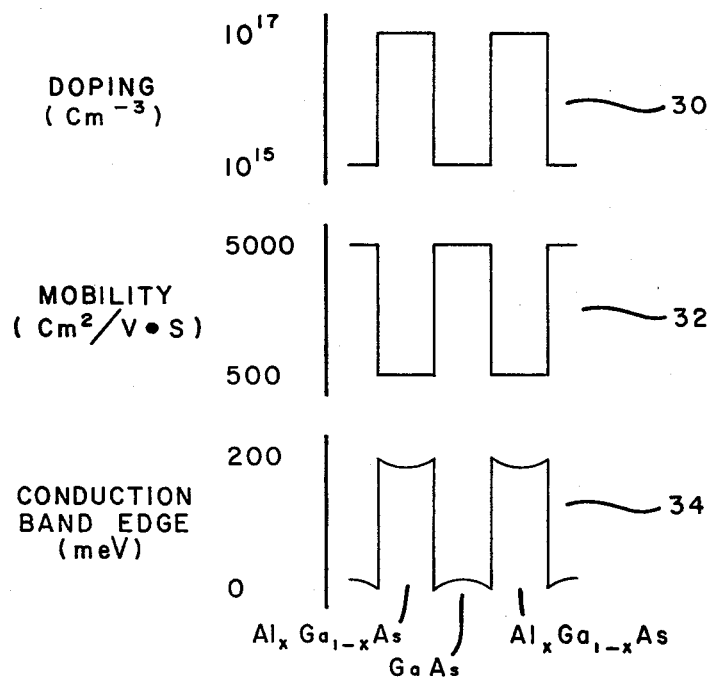
FIG. 2, is a chart showing doping, mobility, and conduction band edge energy variations between succeeding layers of the device of FIG. 1.

Referrring to FIG. 2, during the deposition of the various layers, a doping profile such as shown at 30 is created. Each $Al_xGa_{1-x}As$ layer is doped with donors (e.g., Si, Sn, Te, Se, etc.,). The interspersed GaAs layers may be doped with donors or may be left essentially undoped. As the result of the doping profile 30, and differences in the two types of materials, the electron mobility in each layer is as shown in profile curve 32 with the $Al_xGa_{1-x}As$ layers exhibiting a relatively low mobility compared to the electron mobility of the GaAs. Profile curve 34 shows the relative conduction band energy of the interspersed layers. It can be seen that the GaAs conduction band forms a "potential well" with relation to the adjacent $Al_xGa_{1-x}As$ layers.

Under quiescent conditions, the lower energy of the GaAs conduction band minimum results in electrons spilling from the $Al_xGa_{1-x}As$ layers into the GaAs layer. Once into the GaAs layer, they exhibit a higher mobility (i.e., 5,000 $cm^2/V.s$ or more at 300° K.) because of the greatly reduced impurity scattering and other characteristics of the GaAs. The mobility of electrons in the $Al_xGa_{1-x}As$ however, is made relatively low (i.e., 400 $cm^2/V.s$ or less) by choice of growth parameters (e.g., by purposely forming compensated material).

Figure 3:
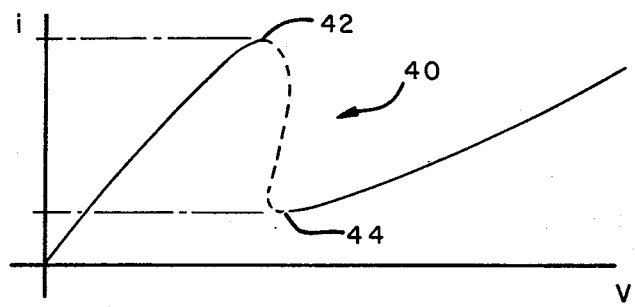
FIG. 3, is a current/voltage characteristic of the device of FIG. 1.

When switch 25 is closed, voltage V is applied through variable resistor 27 to the interspersed layers thereby creating therein an electric field whose axis is parallel to the layer interfaces. The application of a relatively low voltage (low electric field) will result in current conduction in the GaAs layers. As resistance 27 is decreased, an increasing voltage is applied to the structure. The application of the increasing voltage to the $Al_xGa_{1-x}As$ layers will not appreciably increase the the energy of carriers remaining therein due to their relatively low mobility. The increasing voltage and the field generated thereby imparts to the electrons in the GaAs layer a high kinetic energy which causes them to rapidly (i.e., $10^{-11}$ sec) transfer to the $Al_xGa_{1-x}As$ by thermionic emission, diffusion, and drift caused by the electric field created by the donors. As the electrons depart the GaAs layer, the current flowing through the device decreases substantially due to the lower population of electrons in the GaAs and lower mobility of electrons in the $Al_xGa_{1-x}As$. This gives rises to a negative differential resistance effect as shown in FIG. 3, by the dotted portion of curve 40.

The exhibited negative differential resistance is similar to that which occurs in a Gunn effect device; however, its cause differs markedly. In specific, the electrons actually depart the GaAs layer by thermionic emission and are transferred in "real space" to the $Al_xGa_{1-x}As$ layer where their mobility is low. In the Gunn device, electron transfer takes place within the conduction band of the single bulk material.

Referring again to FIG. 3, the ratio of the peak 42 of curve 40 to valley point 44, is known as the "peak to valley ratio" of the device. The GaAs Gunn device normally exhibits a peak to valley ratio of approximately 2, which results in relatively low power efficiencies. The peak to valley ratio for the device shown in FIG. 1 can be adjusted by changing the relative widths of the layers, their relative electron mobilities and the AlAs mole fraction in the $Al_xGa_{1-x}As$ semiconductor material. The mole fraction determines the energy difference between the $Al_xGa_{1-x}As$ and the GaAs conduction bank minima. Adjustment of these various design parameters leads to the availability of high peak to valley ratios (i.e., on the order of 6 or better) which results in high power efficiencies.

The thicknesses of the semiconducting layers of FIG. 1 can vary within wide ranges. The lower limit is set by the ability of the potential well in the GaAs to collect electrons in a reasonably short time. It has been determined that the minimum thickness of the GaAs should be approximately 100 Angstroms or greater. Below that limit, quantum size effects may occur which prevent the collection of the electrons within the desired time limits. The upper limits of thickness of the layers are also determined by speed considerations and by the desire for essentially complete transfer of electrons from the $Al_xGa_{1-x}As$ layers into the GaAs layers at equilibrium. In order to achieve the desired electron transfer speeds (i.e., on the order of $10^{-11}$ secs), the GaAs and the $Al_xGa_{1-x}As$ layers have preferred maximum thicknesses of approximately 1,000 Angstroms and 2,000 Angstroms respectively; however for slower devices, the thicknesses can be increased up to 20,000 Angstroms.

A preferred difference in GaAs - $Al_xGa_{1-x}As$ conduction band edge energies of approximately 100–300 meV is desired. Other compositions of $Al_xGa_{1-x}As$ giving barrier heights between 100 meV and 400 meV are also usable. When, however, the band gap difference exceeds 360 meV, the device exhibits not only a real space electron transfer characteristic but also exhibits a Gunn effect electron transfer within the GaAs conduction band. This leads to an enhanced Gunn effect operation.

The peak-to-valley ratio can be estimated in the following way: at very high fields, the ratio of electrons $N_1$ in the GaAs, to electrons $N_2$ in the $Al_xGa_{1-x}As$ will always be smaller than the ratio of the width of the GaAs, $L_1$, to the width of the $Al_xGa_{1-x}As$, $L_2$. When the electrons are hot, the positively charged donors in the $Al_xGa_{1-x}As$ tend to pull the electrons by the attractive Coulombic force. Assuming that the transition occurs within a small range of electric field, which is typical for the polar optical scattering mechanism, the peak-to-valley ratio, r, is given below:

$$r^{-1} \gtrsim \frac{L_1}{L_1 + L_2} (1 + \frac{\mu_2 L_2}{\mu_1 L_1})$$

Where
$\mu_1$ = mobility in GaAs
$\mu_2$ = mobility in $Al_xGa_{1-x}As$.

It is thus desirable to make the ratios $\mu_2/\mu_1$ and $L_1/L_2$ small. On the basis of this equation, the peak to valley ratio, r, can be estimated. Typical values are as follows—$L_1$(GaAs)=300 Angstroms; $L_2$($Al_xGa_{1-x}As$)=1,200 Angstroms (2 sides); the mobility ratio $\mu_2/\mu_1$=0.05. The peak to valley ratio, r, is then 6.43. The $Al_xGa_{1-x}As$ is inherently a lower mobility material, and in addition, compensation of this material can also be used to lower its mobility. For example, material having a net donor concentration of $N_d-N_a \approx 10^{17} cm^{-3}$ can be achieved by doping with $N_d = 2 \times 10^{17} cm^{-3}$ donors and $N_a = 10^{17} cm^{-3}$ acceptors.

The power efficiency of an rf oscillator employing a device as described above is given by:

$$\eta = \frac{\alpha(1 - r)}{r + \alpha(1 - r)}$$

where $\alpha = (1/\pi\sqrt{2F_v/F_o}) \approx \sqrt{2}/\pi$. Here $F_v$ denotes the field at which the current has its minimum and $F_o$ is the externally induced electric field. For predominantly polar optical scattering in the GaAs, $F_v/F_o = 1$. It is clear that by properly choosing the respective mobilities and widths, very high efficiencies can be obtained. (i.e., twice or better than that of Gunn devices).

Figure 4A:
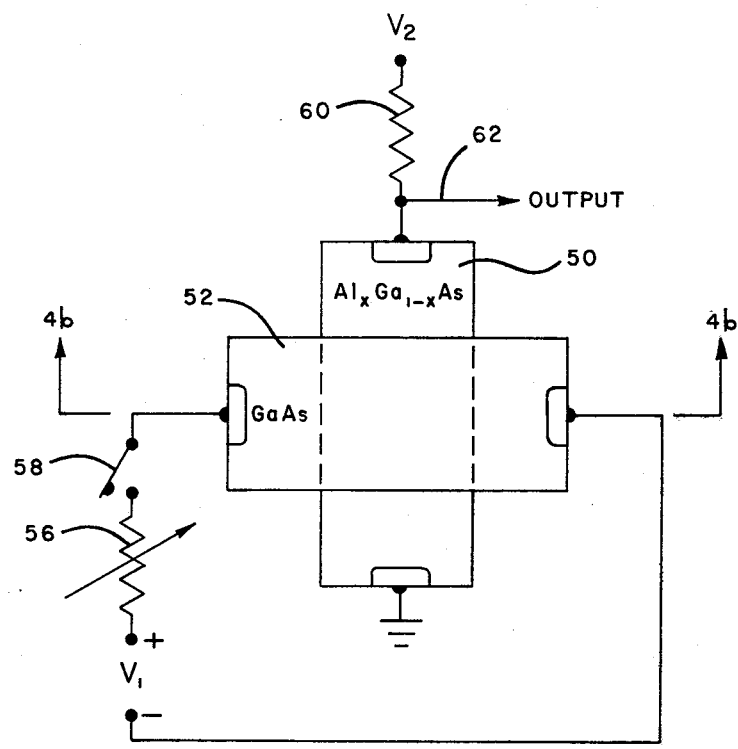
FIG. 4a, is a plan view of a further embodiment of the invention.
Figure 4B:
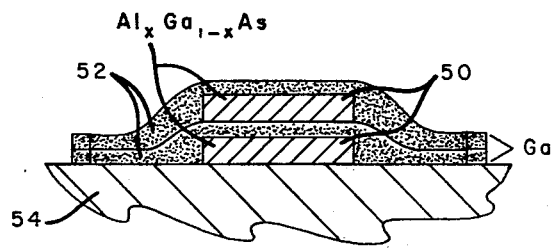

Turning now to FIGS. 4a and 4b, a species of the invention is shown which can be utilized as an electronic switch or a photodetector. $Al_xGa_{1-x}As$ layers 50 are interspersed with GaAs layers 52 on a semi-insulating substrate 54. This species differs from that of FIG. 1 in that the two types of layers are electrically contacted separately. A source of voltage $V_1$ is applied through resistor 56 and switch 58 to the GaAs layers 52, while voltage $V_2$ is supplied via resistance 60 to the $Al_xGa_{1-x}As$ layers 50.

In a quiescent state, (no voltage applied to GaAs layers 52) the charge carriers from the $Al_xGa_{1-x}As$ layers reside within the potential well present in the GaAs layers. Voltage $V_2$, in the quiescent state, is insufficient in magnitude to cause appreciable conduction in the $Al_xGa_{1-x}As$ layers due to the low population and lack of mobility of charge carriers.

The closure of switch 58 causes the application of a voltage $V_1$ to GaAs layers 52 and the carriers residing in the potential wells are transferred into the $Al_xGa_{1-x}As$ layers thereby making them conductive and allowing a current to flow through resistance 60 to ground. The voltage appearing at output terminal 62 is caused to fall to some level determined by the values of resistance 60 and the resistance of $Al_xGa_{1-x}As$ layers 50. Once the carriers are transferred into the $Al_xGa_{1-x}As$ layers 50, they may be contained therein with a very low control current in GaAs layers 52 due to the resulting high resistance of the GaAs.

The structure shown in FIGS. 4a and 4b can also be used as an optical detector since photons with energies sufficient to excite electrons (majority carriers) out of the GaAs potential well can be detected by the resulting change in conductivity of the $Al_xGa_{1-x}As$ (in such a configuration switch 58 may be left open). Sensitivity of this detector to various wavelengths can be adjusted by choosing the depth of the potential well through selection of the $Al_xGa_{1-x}As$ alloy composition.

Figure 5:
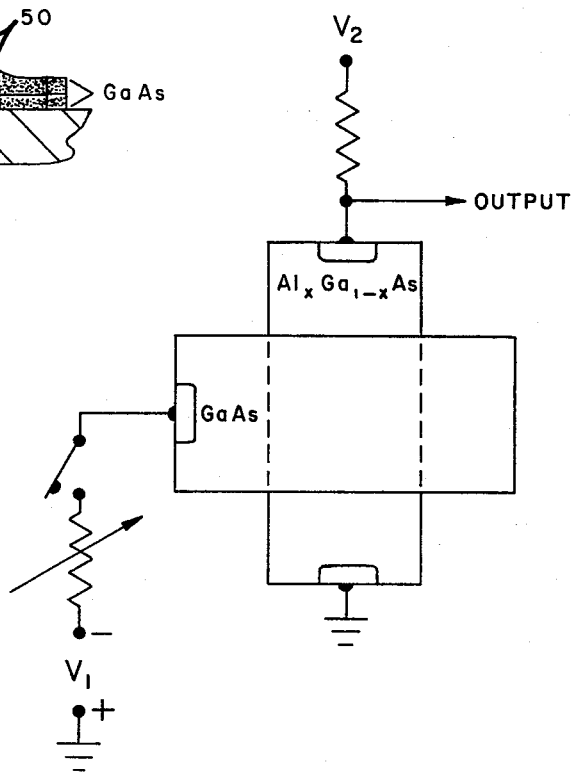
FIG. 5, is a plan view of an embodiment of the invention constructed as a three terminal switch.

The depth of the potential well in the GaAs layer relative to the $Al_xGa_{1-x}As$ layers can be modified by applying a small negative voltage to the GaAs relative to the $Al_xGa_{1-x}As$ (See FIG. 5). This causes the electron potential energy in the GaAs conduction band to be raised.

In this configuration, the application of voltage $V_1$ causes electrons to be transferred out of the GaAs and into the $Al_xGa_{1-x}As$ and the device of FIG. 5 operates as a three terminal switch. Note that the GaAs layers act in much the same manner as the gate of an FET.

The invention can be constructed using a number of known semiconductor production techniques. For instance, either chemical vapor deposition, liquid phase epitaxy or molecular beam epitaxy can be used. Modulation doping can be achieved in a molecular beam epitaxial system by synchronizing the donor and the aluminum source fluxes so that only the $Al_xGa_{1-x}As$ layers are doped with donor impurities. The device as shown in FIGS. 4a, 4b and 5 can be constructed in a molecular beam epitaxy machine by using the mask and rotating it or the sample after each layer is deposited so as to mask the areas where deposition is not desired.

It is to be understood that the above described arrangements are merely illustrative of the many possible specific embodiments which can be devised to represent applications of the principles of the invention described herein. Numerous and varied other arrangements can be devised in accordance with the principles by those skilled in the art without departing from the spirit and scope of the invention. In particular, the various embodiments may be fabricated by a variety of methods from any of a number of materials which are lattice-matched, reflect the proper band gap difference and employ real space charge carrier transfer. Furthermore, while electrons have been described as the main charge carriers, it is also contemplated that any device employing holes as the charge carriers in a real space transfer environment would also be included. Under such conditions however, the charge transfers would take place in the valence band rather than the conduction band.

We claim:

1. A heterojunction device comprising:
   first and second semiconducting layers exhibiting predetermined energy gaps between their conduction and valence bands, said layers exhibiting low mobility and being doped to have charge carriers;

a third high mobility semiconducting layer sandwiched between said first and second layers, and having a lesser energy band gap than said first and second layers, whereby, in a quiescent state, charge carriers from said first and second layers reside in said third layer; and energization means for applying to said third layer an electric field of a strength which imparts sufficient energy to said charge carriers in said third layer to cause their movement into said first and second layers, the axis of said electric field being substantially parallel to the interface between said layers.

2. The invention as defined in claim 1 wherein said charge carriers are electrons.

3. The invention as defined in claim 1, wherein said charge carriers are holes.

4. The invention as defined in claim 1, wherein said charge carriers are of two types, holes and electrons and one type of charge carrier is in excess of the other type.

5. The invention as defined in claim 1, further including a source of potential connected to said first and second semiconducting layers, said source of potential adapted to cause a flow of current in said first and second semiconducting layers upon the application of the electric field by said energization means.

6. The invention as defined in claim 1, further including bias means coupled to said first, second and third semiconducting layers for altering the differences in electron energy between said first and second layers and said third layer respectively.

7. The invention as defined in claim 1, wherein said first and second layers are comprised of $Al_xGa_{1-x}As$ and said third layer is comprised of GaAs.

8. The invention as defined in claim 1, wherein said layers are replicated a number of times in a multilayer structure.

9. The invention as defined in claim 1, wherein the energy level of the conduction band edges of said first and second layers differs from the conduction band edge of said third layer by 100 meV to 400 meV.

10. A heterojunction optical detector responsive to radiant energy exceeding a predetermined magnitude to exhibit a change in its impedance characteristic comprising:

first and second semiconducting layers having predetermined energy gaps between their conduction and valence bands, said layers exhibiting low mobility and being doped to have charge carriers;

potential means connected to said first and second layers and adapted to enable a current to flow through said first and second layers when said layers are in a low impedance state;

a third high mobility semiconducting layer sandwiched between said first and second layers and having a lesser energy band gap than said first and second layers, said charge carriers from said first and second layers residing in said third layer in the presence of radiant energy less than said predetermined magnitude, the application of radiant energy exceeding said predetermined magnitude causing sufficient energy to be imparted to said charge carriers in said third layer to move them into said first and second layers causing said first and second layers to attain said low impedance state.

* * * * *